(12) United States Patent
Tseng et al.

(10) Patent No.: US 9,899,402 B2
(45) Date of Patent: Feb. 20, 2018

(54) FLASH MEMORY HAVING A U-SHAPED CHARGE STORAGE LAYER

(71) Applicants: IMSolution Co., Ltd., Hsinchu County (TW); Yukihiro Nagai, Sapporo, Hokkaido (JP); Riichiro Shirota, Fujisawa, Kanagawa (JP); Hiroshi Watanabe, Yokohama, Kanagawa (JP)

(72) Inventors: Te-Chang Tseng, Zhubei (TW); Yukihiro Nagai, Sapporo (JP); Riichiro Shirota, Fujisawa (JP); Hiroshi Watanabe, Yokohama (JP)

(73) Assignee: IM Solution Co., Ltd., Zhubei (TW)

( * ) Notice: Subject to any disclaimer, the term of this patent is extended or adjusted under 35 U.S.C. 154(b) by 0 days.

(21) Appl. No.: 15/412,128

(22) Filed: Jan. 23, 2017

(65) Prior Publication Data
US 2017/0221916 A1 Aug. 3, 2017

(30) Foreign Application Priority Data
Feb. 3, 2016 (JP) ................................. 2016-019363

(51) Int. Cl.
*G11C 16/04* (2006.01)
*H01L 27/11568* (2017.01)
*H01L 27/11573* (2017.01)
*H01L 29/423* (2006.01)
(Continued)

(52) U.S. Cl.
CPC .. *H01L 27/11568* (2013.01); *H01L 27/11573* (2013.01); *H01L 27/11582* (2013.01);
(Continued)

(58) Field of Classification Search
CPC .................................................. G11C 16/0433
(Continued)

(56) References Cited

U.S. PATENT DOCUMENTS 5,408,115 A 4/1995 Chang
6,955,963 B2 * 10/2005 Deleonibus ....... H01L 21/28273
257/E21.209

(Continued)

OTHER PUBLICATIONS

Hideto Hidaka, Evolution of Embedded Flash Memory Technology for MCU, 2011, 4 pages, IEEE.
(Continued)

*Primary Examiner* — Son Mai
(74) *Attorney, Agent, or Firm* — Alan D. Kamrath; Kamrath IP Lawfirm, P.A.

(57) ABSTRACT

A cheap and high performance 1.5 transistor-type flash memory highly compatible externally of a memory region has a sacrifice film formed on a substrate. A U-shaped groove is formed on the sacrifice film, where multiple insulating films are laminated. The multiple insulating films includes a silicon nitride film as a charge storage layer. Low resistive material is disposed on the multiple insulating films to form a control gate. The select gate is formed on the insulating film on a side of the control gate in a self-aligned manner. Semiconductor regions opposite in conductivity to the substrate on both sides of the adjoining control gate and the select gate form a source and a drain, respectively. Thus, a 1.5 transistor-type flash memory is formed with the adjoining control gate and the select gate between the source and the drain. In a MOS-type transistor with the control gate, the threshold voltage is changeable according to injection/emission of the charge to the silicon nitride as the charge storage layer, and thus work as a non-volatile memory.

16 Claims, 14 Drawing Sheets

(51) Int. Cl.
*H01L 29/51* (2006.01)
*H01L 29/16* (2006.01)
*H01L 27/11582* (2017.01)
*H01L 29/49* (2006.01)
*G11C 5/06* (2006.01)

(52) U.S. Cl.
CPC ........ *H01L 29/16* (2013.01); *H01L 29/42344* (2013.01); *H01L 29/42348* (2013.01); *H01L 29/513* (2013.01); *G11C 5/063* (2013.01); *G11C 16/0433* (2013.01); *G11C 16/0466* (2013.01); *H01L 29/495* (2013.01); *H01L 29/4916* (2013.01); *H01L 29/4966* (2013.01)

(58) Field of Classification Search
USPC ..................................................... 365/185.14
See application file for complete search history.

(56) References Cited

U.S. PATENT DOCUMENTS

| | | | |
|---|---|---|---|
| 8,035,155 B2* | 10/2011 | Sakai | H01L 21/28273 257/314 |
| 9,583,641 B1* | 2/2017 | Chang | H01L 29/7923 |
| 2007/0218633 A1* | 9/2007 | Prinz | B82Y 10/00 438/267 |

OTHER PUBLICATIONS

Yoshiyuki Kawashima, Takashi Hashimoto and Ichiro Yamakawa, Investigation of the Data Retention Mechanism and Modeling for the High Reliability Embedded Split-Gate MONOS Flash Memory, 2015, 5 pages, IEEE.

* cited by examiner

FLASH MEMORY HAVING A U-SHAPED CHARGE STORAGE LAYER

CROSS REFERENCE TO RELATED APPLICATIONS

The application claims the benefit of Japan application serial No. 2016-019363, filed on Feb. 3, 2016, and the subject matter of which is incorporated herein by reference.

BACKGROUND OF THE INVENTION

1. Field of the Invention

The present invention generally relates to the structure of a flash memory and, more particularly, to an electrically erasable and programmable non-volatile semiconductor memory device and its methods of read, write and erasure.

2. Description of the Related Art

Until we arrive at the present, there are many proposals and practical applications of various NOR-type flash memories. As illustrated in FIG. 16, there are two major types of practical applications. One is a floating gate type as a memory cell of flash memory. The other is a type of flash memory, with charge stored in silicon nitride film (SONOS hereinafter). (See "Evolution of Embedded Flash Memory Technology for MCU" as published by Hideto Hidaka in IEEE ICICDT 2011, Tech. dig) Moreover, the flash memories whose memory cells comprise "1-transistor", "1.5-transistors", or "2-transistors" per cell have been practically applied. The "1.5-transistors" type has 2 transistors in one memory cell, but the space between the 2 transistors is smaller than the space of the "2-transistors" type. So, it is named the "1.5-transistors" type in this invention. They potentially have advantages and disadvantages. Considering the cell size, the cell structures of the "1.5-transistors" and "2-transistors" types may cause the disadvantage of cell size increase owing to the increased number of transistors per cell compared with the "1-transistor" type. In addition, the "1.5-transistors" type has a large cost increase due to the complicated structures. Thus, the "1-transistor" memory cell with a floating gate has been widely used as a batch erase NOR-type flash memory. However, this type of flash memory likely causes over-erase when erasing, which leads to a narrow operation margin.

FIG. 17 is a drawing to illustrate the cross-sectional view of the conventional SONOS flash memory cell of the "1.5 transistors" type. FIG. 18 is a drawing to illustrate the equivalent circuit of a memory cell array of those SONOS flash memory cells. (See U.S. Pat. No. 5,408,115) (See Non "Investigation of the Data Retention Mechanism and Modeling for the High Reliability Embedded Split-Gate MONOS Flash Memory" as published by Yoshiyuki Kawashima, Takashi Hashimoto, Ichiro Yamakawa in IEEE IRPS 2015). The memory cell 30 shown in FIG. 17 comprises a MOS-type transistor having a 3-layer insulating film 33 and a control gate 32 thereon on the right side of the figure and a MOS transistor having a 1-layer gate oxide and a select gate 36 thereon. Those transistors are nearest neighbors to each other on a P-type silicon substrate 31 or a P-well thereon, and two N-type diffusion layers are formed. One of them, on the side of the MOS-type transistor having the 3-layer insulating film 33, is a source 34. The other is a drain 35. The 3-layer insulating film 33 is a lamination comprising silicon oxide (33-1 in FIG. 18), silicon nitride (33-2 in FIG. 18), and silicon oxide (33-3 in FIG. 18) from the substrate. The silicon nitride 33-2 plays a role of a charge trapping layer.

FIG. 18 illustrates the memory cell array 40 with the memory cells 30 in FIG. 17 arrayed in a matrix. In this matrix array of those memory cells, there are control gate lines 32-1 and 32-2 which connect to the control gate 32 of the memory cell 30 in FIG. 17, select gate lines 36-1 and 36-2 which connect to the select gate 36 of the memory cell 30 in FIG. 17, and a source line 37 along the column direction. There are bit lines 38-1 and 38-2 which connect to the drain 35 of the memory cell 30 in FIG. 17 along the row direction. The sources 34 and the drains 35, which are parallel-arrayed along the column direction, connect to the source line 37 and the bit lines 38-1 or 38-2, respectively, and may be used for controlling the memory cell array 40.

To write the memory cell 30, a hot electron injection (depicted SSI hereinafter) is performed by applying about 5V, about 0V, about 10V, and about 1V to the source 34, the drain 35, the control gate 32, and the select gate 36, respectively. The high electric field is applied on a space between the select gate 36 and the control gate 32. Then, a portion of electrons having high energy are injected into the silicon nitride 33-2 serving as the charge storage layer, and, then, the threshold voltage of the transistor with the control gate 32 is increased.

To erase the memory cell 30, the tunneling phenomena of valence electrons to the conduction band (depicted BTBT hereinafter) is performed by applying a high voltage more than 4V, about −5V, and about 0V to the source 34, the control gate 32, and the select gate 36, respectively. However, the drain 35 is floating or grounded. This causes the BTBT, and, then, holes having high energies are generated on the source side of the transistor with the control gate 32. A portion of those holes injects into the silicon nitride 33-2 serving as a charge storage layer. Thus, the threshold voltage of the transistor with the control gate 32 is shifted negative.

To fabricate the conventional type of SONOS flash memory with "1.5 transistors" per cell, which is illustrated in FIG. 17, the select gate 36 is first formed, and, then, the control gate 32 is formed right thereto by a kind of self-align method. Thereby, the select gate 36 is influenced by a thermal process at the step of forming the control gate 32. In general, on the other hand, the select gate 36 is simultaneously formed with periphery memory cell control circuit transistors or other logic circuit transistors, in order to reduce the complexity of the fabrication process and the manufacturing cost. In this event, those periphery memory cell control circuit transistors or other logic circuit transistors are also influenced by the thermal process at the step of forming the control gate 32, and, then, the characteristics of periphery memory cell control circuit transistors or other logic circuit transistors degrade. Moreover, since the 3-layer insulating film 33 and the control gate 32 to be used in the memory cell are formed after forming those periphery memory cell control circuit transistors or other logic circuit transistors, it has been necessary to avoid an excess 3-layer insulating film 33 and control gate 32 to be formed in the region of the periphery memory cell control circuit or other logic circuit for suppressing the influence on the periphery memory cell control circuit transistors or other logic circuit transistors there. This also has caused the manufacturing process to be complex. In addition, a metal silicide film has been formed on the polysilicon of the control gate 32 and the select gate 36 to reduce the resistivity. However, this increases the difficulty of manufacturing owing to the vital risk of a short of the adjoining control gate 32 and select gate 36.

SUMMARY OF THE INVENTION

In the conventional technologies, as mentioned above, the process of forming the control gate later has caused the manufacturing process to be difficult and complex. In addition, the influence on the periphery memory cell control circuit transistors or other logic circuit transistors have been a serious problem. The present invention aims to propose a flash memory with "1.5-transistors", which can resolve those problems.

In the fabrication process of the flash memory related to the present invention, as illustrated in FIG. 19, a first sacrifice film, which may be a silicon-oxide film 24 and a second sacrifice film, which may be a silicon-nitride film 25, are formed on P-well 1 in the region of the memory cell to serve as sacrifice films. Subsequently, a U-shaped groove is formed on a portion of those sacrifice films for exposing the silicon surface in the P-well therein. Then, an insulating film 14 and multiple insulating films 4 are formed thereon. A medial insulating film laminated in the multiple insulating films serves as a charge storage layer, and may be a Silicon nitride film. A low resistive material is deposited on the multiple insulating films 4 to form a control gate 5. As illustrated in FIG. 20, an insulating film 12 is formed on the control gate 5 in a self-aligned manner, and, then, the second sacrifice film 25 is removed. As illustrated in FIG. 21, a gate insulating film 6 is formed after removing the sacrifice film 24. A select gate 7 and a pseudo-gate 7' are formed at the side walls of the control gate 5 and the insulating film 12 thereon and on the gate insulating film 6 by a self-alignment method. As illustrated in FIG. 22, the select gate 7 is left there while removing the pseudo-gate 7'. There are semiconductor regions which are an opposite conductive type to the P-well 1 in the memory cell region at both ends of the adjoining control gate 5 and the select gate 7. Those semiconductor regions serve as a source 3-2 and a drain 3-1, respectively. In this way, a memory cell is configured by the source 3-2, the drain 3-1 and two MOS transistors with the adjoining control gate 5 and the select gate 7 therebetween, which transistors are formed in a self-alignment manner.

As illustrated in the brief description of the fabrication process in FIGS. 19-22, the select gate 7 is formed in a self-aligned manner after forming the control gate 5. Thereby, the periphery memory cell control circuit transistors or other logic circuit transistors are able to be formed at the same moment with the select gate 7 after forming the control gate 5, and, then, the periphery memory cell control circuit transistors or other logic circuit transistors are free from influence, such as performance degradation of those transistors due to the thermal process to form the control gate 5.

As illustrated in the brief description of the fabrication process in FIGS. 19-22, the periphery memory cell control circuit transistors or other logic circuit transistors may be simultaneously formed with the select gate 7 after forming the control gates 5. Then, the fabrication process of the control gates 5 almost may not hardly influence the periphery memory cell control circuit transistors or other logic circuit transistors. Thereby, the manufacturing process of the flash memories with "1.5 transistors" per cell, which has been conventionally complicated, may be replaced with a simple one.

Moreover, the control gate 32 in FIG. 17 has been a composite film of polysilicon and metal silicide films in the prior arts. In this invention, as in the brief description of the fabrication process illustrated in FIGS. 19-22, the control gate 5 may be entirely made of metal, which may reduce the wiring resistivity.

Additionally, a metal silicide film has been formed on the poly-crystalline silicon of the control gate 32 and the select gate 36, which are shown in FIG. 17, to reduce resistivity in the prior arts. This likely causes the short of the adjoining control gate 32 and the select gate 36. However, as briefly described in FIGS. 19-22 in the present invention, the control gate 5 having been formed of a metallic layer is covered by an insulating film before forming the select gate 7 including the metal silicide film. Accordingly, the adjoining control gate 32 and select gate 36 almost may not short-circuit each other.

Furthermore, as in the fabrication method briefly described in FIGS. 19-22, the etching depth of the surface of a P-well 1 may intentionally be tuned in the etching step to form the U-shaped groove. Accordingly, it intentionally tunes the level difference between the bottom of the multiple insulating films of the control gate 5 and the bottom of the select gate 7. This tuning may simplify the optimization of program, erase, and read of the flash memory.

Furthermore, the select gate transistor may be able to control punch-through between the source and the drain by aligning the select gate 7 next to the control gate 5. This may enable the channel length across the control gate 5 and the select gate 7 to be shorter, and reduce the memory cell area.

Furthermore, the SSI programs the memory cell by aligning the select gate 7 next to the control gate 5. This may reduce bit line voltage.

Furthermore, as briefly described in the fabrication method illustrated in FIGS. 2 and 12 and FIGS. 19-22, it intentionally makes the level of the control gate 5 in the cell isolation region higher or lower than in the other regions while etching the U-shaped groove. In this way, it installs the level difference between a portion of the control gate 5 overlapping with the cell isolation region and the other parts. This may expand the channel region from the plateau of the top surface of the P-well 1 to the side walls of the U-shaped groove. This may cause an electric current of the cell transistor to increase, and, then, the read speed may be increased.

BRIEF DESCRIPTION OF THE DRAWINGS

The present invention will become more fully understood from the detailed description given hereinafter and the accompanying drawings which are given by way of illustration only, and thus are not limitative of the present invention, and wherein.

DETAILED DESCRIPTION OF THE INVENTION

Hereinafter, the embodiments related to the present invention are illustrated with the drawings, with similar components or elements labeled with a same symbol. In addition, the present invention is not limited to flash memories, with a flash memory adopted as an example to illustrate the present invention. Moreover, the present invention is not limited to the embodiments disclosed in the present invention.

Figure 1:
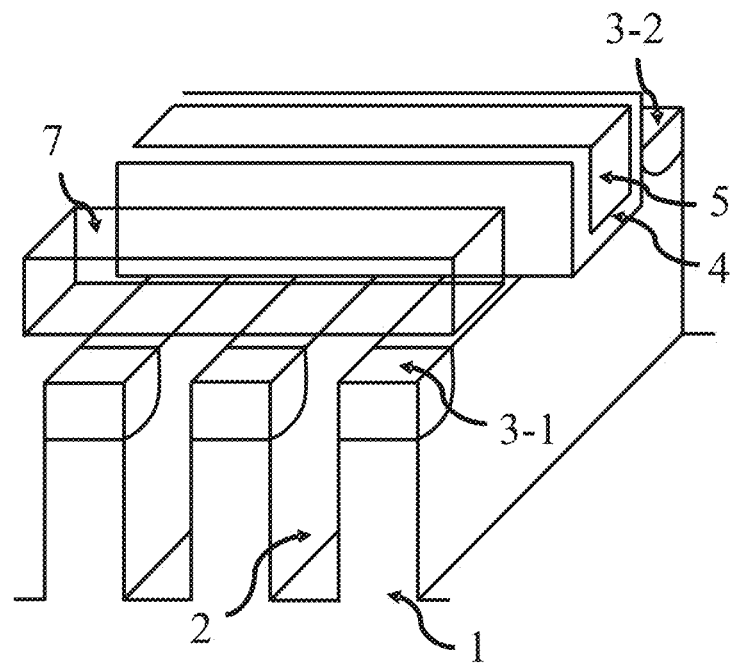
FIG. 1 is a diagrammatic view of the basic structure of memory cell related to the present invention.
Figure 2:
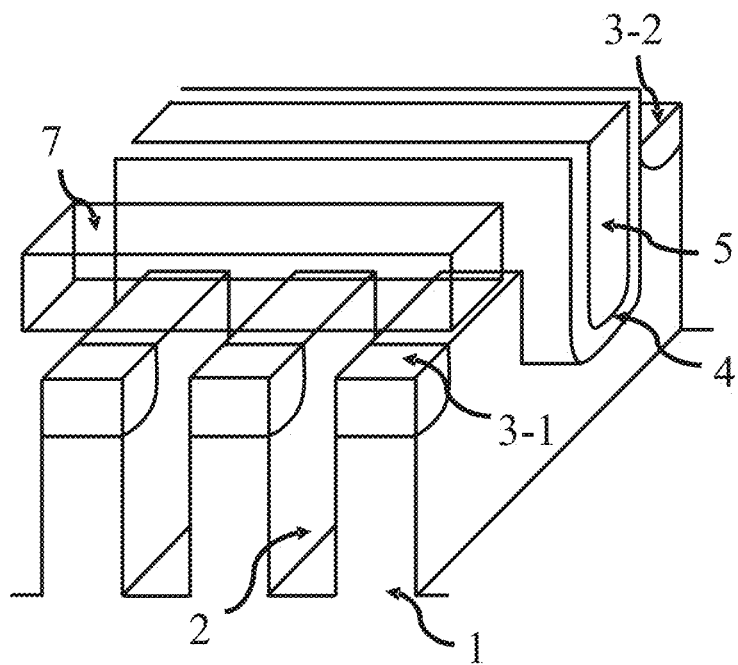
FIG. 2 is a diagrammatic view of the memory cell array related to FIG. 1, where the bottom of the control gate is lower in the cell isolation region than in the other regions.
Figure 3:
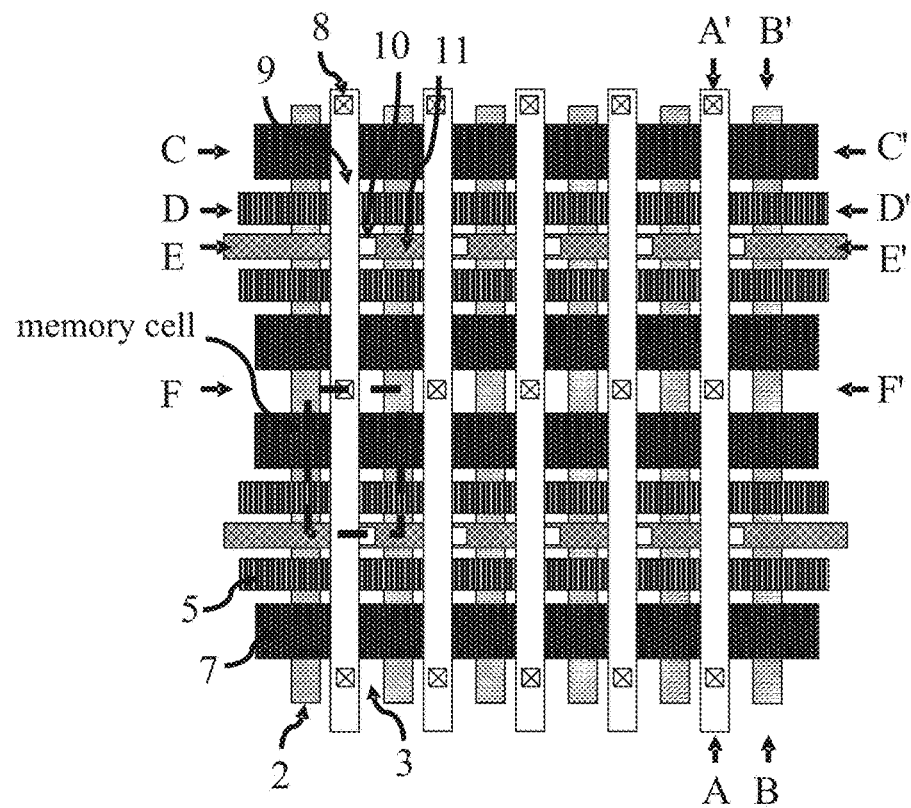
FIG. 3 is a horizontal projection corresponding to FIG. 1 and FIG. 2.

FIGS. 1 and 2 are the diagrammatic views of a memory cell structure related to the present invention. In FIG. 1, a select gate 7 and a control gate 5 are lengthened in parallel, and the cell isolation regions 2 are formed perpendicular to the select gate 7 and the control gate 5 on the P-well 1 in the memory cells which is isolated from adjoining memory cells along this direction. Moreover, another control gate 5, another select gate 7, and diffusion layers of another source and drain are similarly formed in the region of another memory cell across the cell isolation region 2. Those adjoining drains, those adjoining control gates 5, those adjoining select gates 7, and channels below the adjoining control gates 5 and the adjoining select gates 7 are electrically disconnected with each other by the cell isolation region 2, respectively. The select gate 7 and the control gate 5 are expanded perpendicular to the cell isolation region 2 and shared by adjoining memory cells across the cell isolation region 2. The MOS-type transistor having the control gate 5 serves as a non-volatile memory cell, where a threshold voltage is controllable with amount of charge stored in the silicon nitride film serving as a charge storage layer. The amount of stored charge is tuned by injecting a charge to or removing a charge from the charge storage layer. FIG. 3 is the horizontal projection of the memory cell. The cell isolation region 2 is formed on the surface of the P-well 1 in the memory cell region. The control gate 5 is subsequently formed in the U-shaped groove. The select gate 7 is then formed next to the control gate 5 in a manner of self-alignment. On the other hand, after forming the isolation region 2, the control gate 5 and the select gate 7, N-type diffusion layers have been formed on both sides of the adjoining control gate 5 and the select gate 7. Those N-type diffusion layers 3 serve as a drain (N-type diffusion layer 3-1) and a source (N-type diffusion layer 3-2), respectively. The bit line contact and the source line contact are installed in the N-type diffusion layers 3-1 (drain) and 3-2 (source), respectively, in each memory cell. In FIG. 1, the bottom of the multiple insulating films 4 beneath the control gate 5 is nearly the same in height as the surface of the N-type diffusion layers 3-1 and 3-2. In FIG. 2, the bottom of the multiple insulating films 4 beneath the control gate 5 is lower than the surface of the N-type diffusion layers 3-1 and 3-2 in the cell isolation region. The cell isolation regions 2 are installed in-line perpendicular to the adjoining control gate 5 and the select gate 7 to isolate the N-type diffusion layers 3-1 and 3-2 from one to other memory cells. In addition, the multiple insulating films 4 cover the side wall and the bottom of the control gate 5. The multiple insulating films 4, for example, comprises 3-layer insulating films, and the second insulating layer serves as a charge storage layer of the memory cell to store a positive or negative charge.

Figure 15:
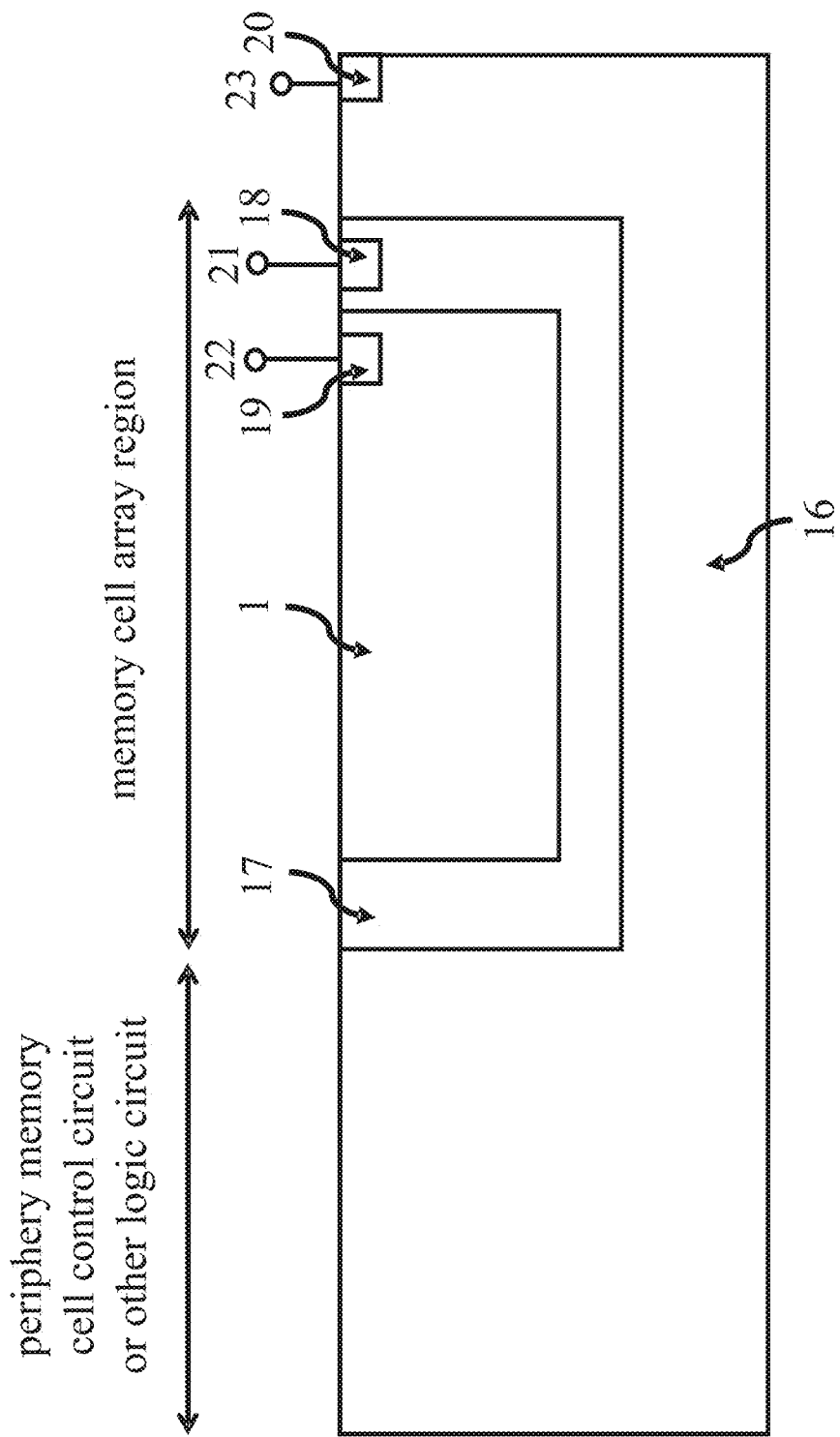
FIG. 15 is a diagrammatic view of the well structure in the memory cell region and the periphery memory cell control circuit or other logic circuit, which are related to the present invention.
Figure 16:
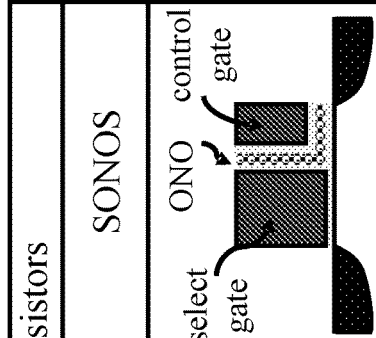
FIG. 16 shows a variety of conventional memory cells.
Figure 17:
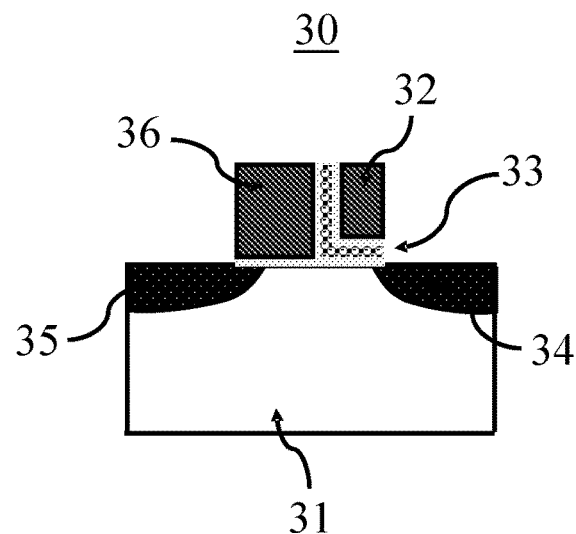
FIG. 17 is a cross-sectional view of a conventional memory cell.
Figure 18:
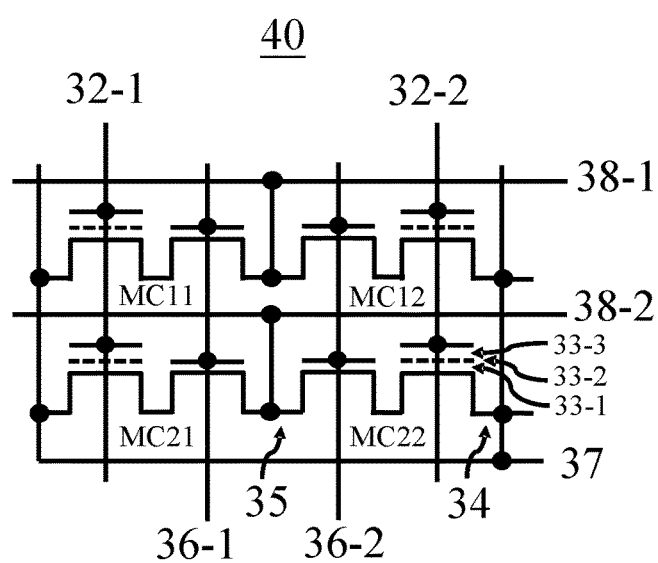
FIG. 18 is an equivalent circuit diagram corresponding to FIG. 17.

FIG. 15 is the cross-sectional view of the silicon substrate including the memory cell array and the periphery memory cell control circuit or other logic circuit region. The periphery memory cell control circuit or other logic circuit is formed on the surface of the P-silicon substrate 16. In the region of the memory cell array, the N-well 17 is first formed on the surface of the P-type silicon substrate 16, and, then, the P-well 1 is formed therein. The memory cells are formed on the P-well 1. The potential of the surface of the P-type silicon substrate 16 is given through the P-type diffusion layer 20 by the substrate electrode 23. The potential of the N-well 17 is given though the N-type diffusion layer 18 by the N-well electrode 21. The potential of the P-well 1 is given through the P-type diffusion layer 19 by the P-well electrode 22. In the case that neither the P-well 1 nor the N-well 17 are biased positively, or in the case that the P-type silicon substrate 16 is not biased negatively, the well structures illustrated in FIG. 15 are removed, and, then, the memory cell may be formed in the P-type silicon substrate 16. Like this, the structure with neither the N-well nor the P-well is illustrated in the present invention. However, the present invention is not limited to this structure. According to the necessity of the periphery memory cell control circuit or other logic circuit, N-wells and P-wells may be approved to be formed.

Figure 7:
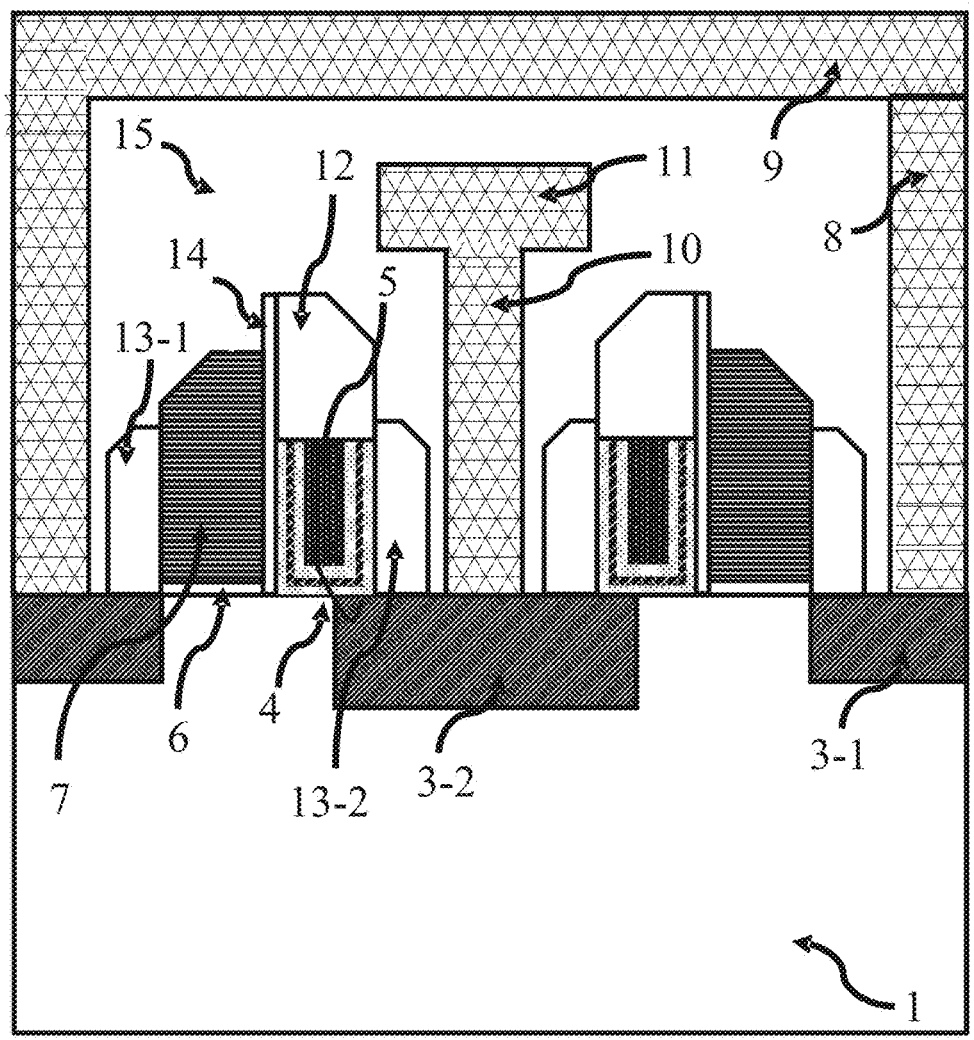
FIG. 7 is a cross-sectional view along A-A' line in FIG. 3.
Figure 8:
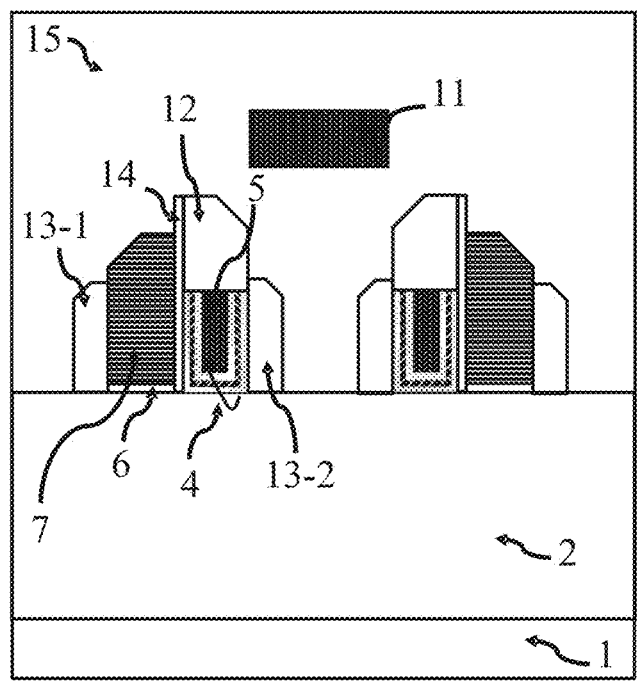
FIG. 8 is a cross-sectional view along B-B' line in FIG. 3.
Figure 9:
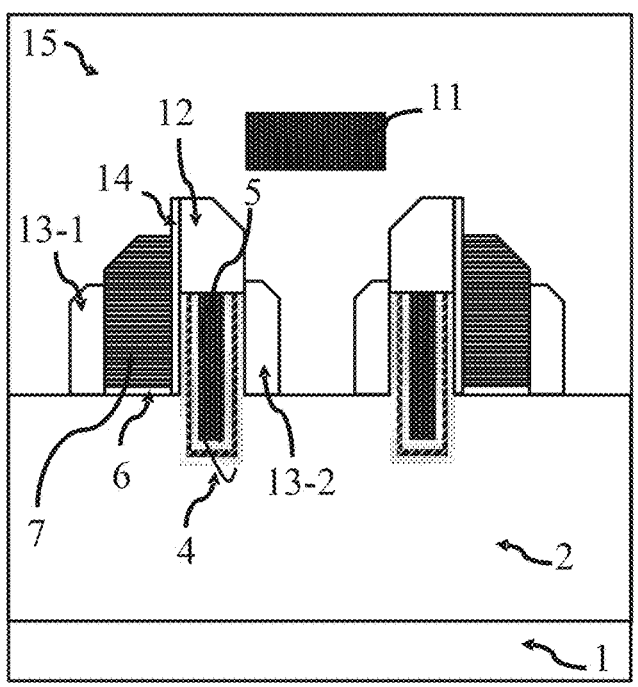
FIG. 9 is a cross-sectional view along B-B' line in FIG. 3 and related to FIG. 8, where the bottom of the control gate is lower in the cell isolation region than the other regions.

FIG. 3 is the horizontal projection including the bit lines 9 and the source line 11. The portion surrounded by a dotted line is an area for one memory cell. The bit lines 9 and the source lines 11 are metal wirings which are perpendicular to each other. They are in levels above the N-type diffusion layer 3. The metal wiring of the bit line 9 is in a layer different from the metal wiring of the source line 11. The bit line contacts 8 are respectively connected to the N-type diffusion layers 3-1 of the memory cells. Then, the N-type diffusion layers 3-1 are electrically connected to the bit lines 9. The source line contacts 10 are respectively connected to the N-type diffusion layers 3-2 of the memory cells. Then, the N-type diffusion layers 3-2 are electrically connected to the source lines 11. The control gate 5 and the select gate 7 in FIGS. 7-9 are expanded to cross the memory cell array, and then serve as a part of wiring. In that sense, when attention is focused on the memory cell arrays or the equivalent circuit diagrams, they may be also called the control gate line 5 and the select gate line 7, respectively. The adjoining control gate lines 5, the select gate lines 7, and the source line 11 are parallel to each other and perpendicular to the bit line 9. The cell isolation region 2 is parallel to the bit line 9.

Figure 4:
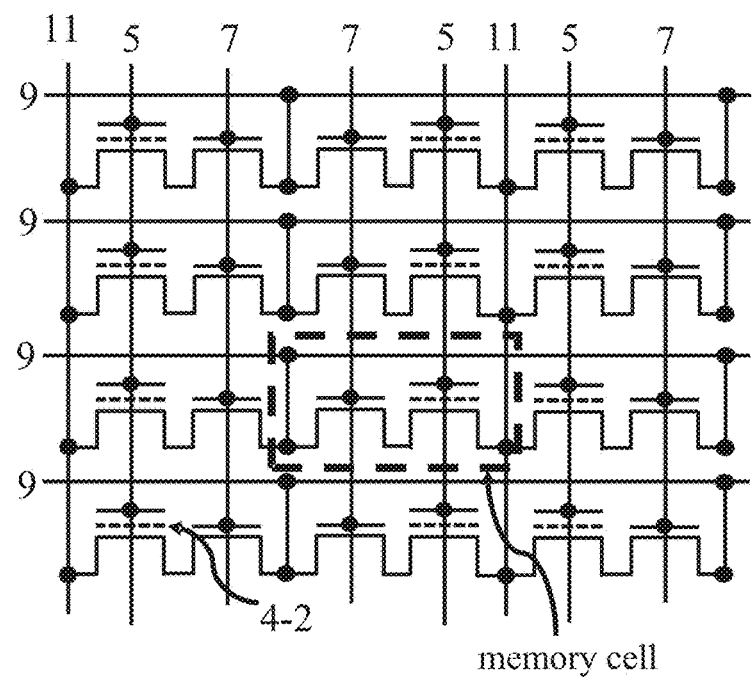
FIG. 4 is an equivalent circuit diagram of the memory cell array corresponding to FIGS. 1-3.

In FIG. 4, the equivalent circuit diagram, which corresponds to FIG. 3, is shown. (However, FIG. 4 is turned 90 degrees.) A plurality of memory cells is distributed to form a memory cell array. The region surrounded by dotted line is a region for one memory cell, and where there are the adjoining control gate 5 and the select gate 7. A plurality of adjoining control gates 5 and select gates 7 is vertically expanded in parallel. The gate insulating film under the control gate 5 is multiple insulating films 4 which comprise a 3-layer insulating film for example. The second layer of the insulating film is able to store a positive or negative charge as a charge storage layer of the memory cell. The N-type diffusion layer 3-1 of the memory cell is linked to the bit line 9 via the bit line contact. The N-type diffusion layer 3-2 of the memory cell is linked to the source line 11 via the source line contact.

Figure 5:
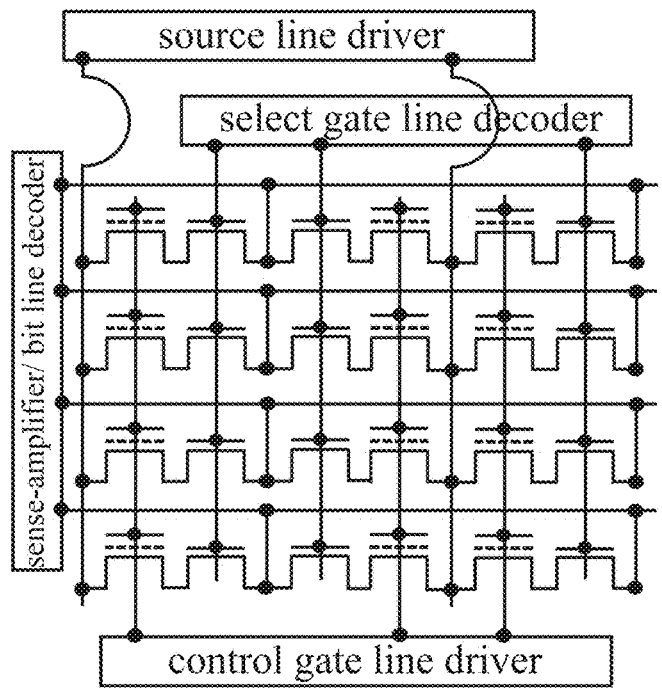
FIG. 5 is an equivalent circuit diagram of the memory cell array related to FIG. 4.

FIG. 5 is the equivalent circuit diagram of the memory cell array related to FIG. 3. The control gate lines 5, the select gate lines 7, the bit lines 9, and the source line 11, which are used in FIG. 4, are connected to peripheral circuits such as: the control gate lines 5 to the control gate decoder, the select gate lines 7 to the select gate decoder, the bit lines 9 to the sense-amplifier or the bit line decoder, and the source lines 11 to the source line driver.

Figure 6:
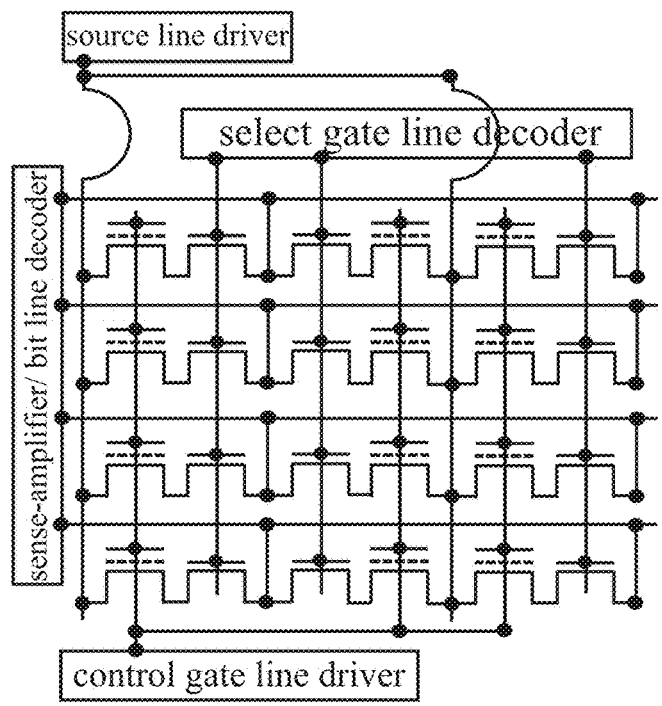
FIG. 6 is an equivalent circuit diagram of the memory cell array corresponding to FIGS. 4 and 5.

FIG. 6 is the equivalent circuit diagram of the memory cell array related to FIG. 3, where the control gate lines 5 are combined with each other to form a common control gate line. The number of control gate lines to be actually combined may be selected from two as the minimum unit of combination to the maximum, i.e., the number of all control gate lines 5 in the memory cell array as necessary. On the other hand, the source lines 11 are combined with each other to form a common source line. The number of source gate lines to be actually combined may be selected from two as the minimum unit of combination to the maximum, i.e., the number of all source lines 11 in the memory cell array as necessary.

FIG. 7 is the cross-sectional view along A-A' line in FIG. 3. The cross-section of FIG. 7 is cut out of a plane parallel to the cell isolation regions 2, which is installed parallel to the bit lines 9 on the P-well 1. The select gate 7 is formed from the shape of the control gate 5 in a self-aligned manner, where the control gate 5 and the select gate 7 are isolated by the multiple insulating films 4 and the insulating film 14 between the multiple insulating films and the select gate. This insulating film 14 between the multiple insulating films and the select gate line may be removed. The multiple insulating films 4 are below and on the side of the control gate 5. The multiple insulating films 4 at the bottom of control gate 5 may serve as a gate insulating film. There is a gate insulating film 6 of the select transistor below the select gate 7. The top of the control gate 5 is covered by an insulating film 12. There is an insulating film near to a bit line contact for a Drain and Gate distance control between the bit line contact 8 and the select gate 7 as the same as the transistors of the periphery memory cell control circuit or other logic circuit transistors. Each of the plurality of transistors includes a gate insulating film. There is an insulating film near to the source line contact for Source and Gate distance control between the source line contact 10 and the control gate 5 as the same as the transistors of the periphery memory cell control circuit or other logic circuit transistors. Both or either of those insulating films (13-1 and 13-2) may be removed. In addition, the N-type diffusion layers 3-1 and 3-2 are formed on the P-Well 1. The N-type diffusion layer 3-1 below the bit line contact 8 is connected to the bit line 9 through the bit line contact 8. The N-type diffusion layer 3-2 below the source line contact 10 is connected to the source line 11 through the source line contact 10. The N-type diffusion layer 3-1 may horizontally overlap with the gate insulating film 6 of the select gate, but it is not necessary to limit the overlap area and ratio. The N-type diffusion layer 3-2 may horizontally overlap with the multiple insulating films 4, wherein but it is not necessary to limit the overlapped area and ratio. The control gate 5 and the select gate 7 are expanded parallel to the source line 11 and arrayed perpendicular to the bit line 9 and the cell isolation region 2. Those wirings and cells are disconnected with each other by an insulating film 15 between the layers and those wirings.

FIGS. 8 and 9 are the cross-sectional views along B-B' line in FIG. 3. FIG. 8 shows the cross-section where the bottom of the control gate 5 is the same in height as the substrate surface in the cell isolation region 2. FIG. 9, which is a subsidiary of FIG. 8, shows the cross-section where the bottom of the control gate 5 is lower in level than the substrate surface except in the cell isolation region 2. It is not necessary to limit the height difference or the ratio of height difference. The bottom of the laminated insulating films 4 below the control gate 5 has a height lower than a height of a bottom of the select gate insulating film 7.

Figure 10:
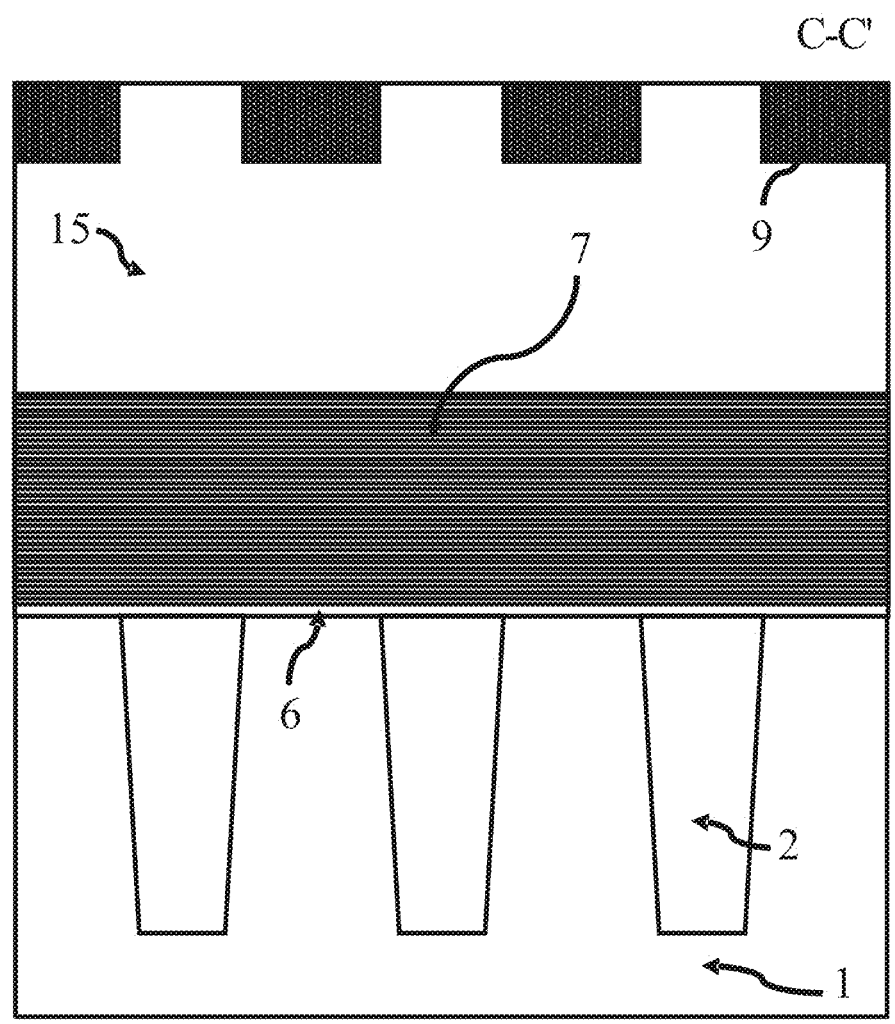
FIG. 10 is a cross-sectional view along C-C' line in FIG. 3.

FIG. 10 is the cross-sectional view along C-C' line in FIG. 3, which is cut out along the select gate line 7. The select gate line 7 formed from the shape of the control gate 5 in a self-aligned manner has the gate insulating film 6 below the select gate.

Figure 11:
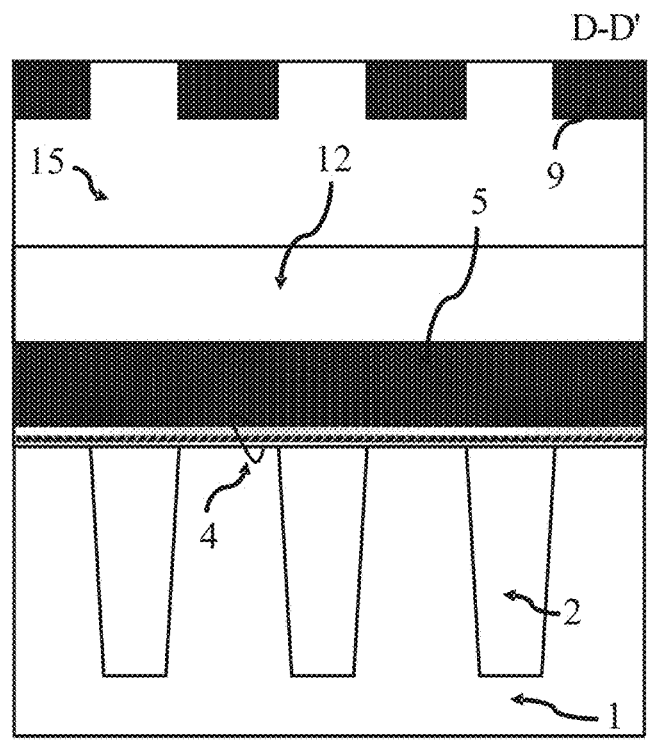
FIG. 11 is a cross-sectional view along D-D' line in FIG. 3.
Figure 12:
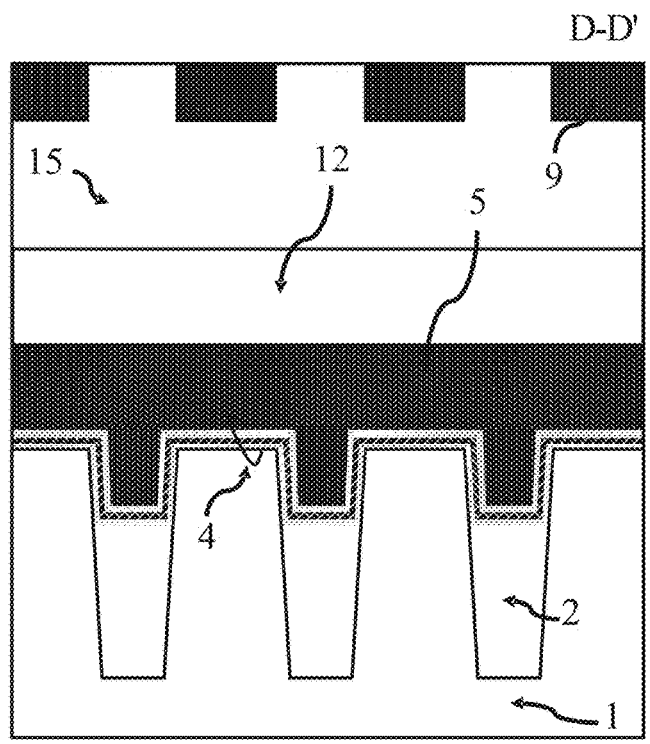
FIG. 12 is a cross-sectional view along D-D' line in FIG. 3 and related to FIG. 11, where the bottom of control gate is lower in the cell isolation region than the other regions.

FIGS. 11 and 12 are the cross-sectional views along D-D' line in FIG. 3. These cross-sections are cut out along the control gate line 5 and neighboring to that of FIG. 10. There is the multiple insulating films 4 serving as the gate insulating film below the bottom of the control gate line 5. FIG. 12, which is a subsidiary of FIG. 11, shows the cross-section where the bottom of the control gate 5 is lower in height than the substrate surface except external of the cell isolation region 2. It is not necessary to limit the height difference or the ratio of the height difference.

Figure 13:
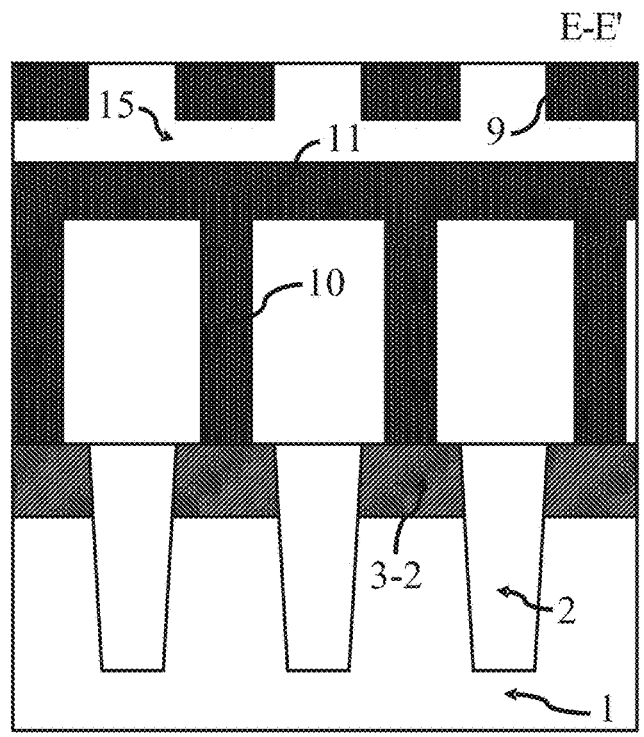
FIG. 13 is a cross-sectional view along E-E' line in FIG. 3.

FIG. 13 is the cross-section along E-E' line in FIG. 3, where the cross-section is cut out on the source line 11 and neighboring to those of FIGS. 11 and 12.

Figure 14:
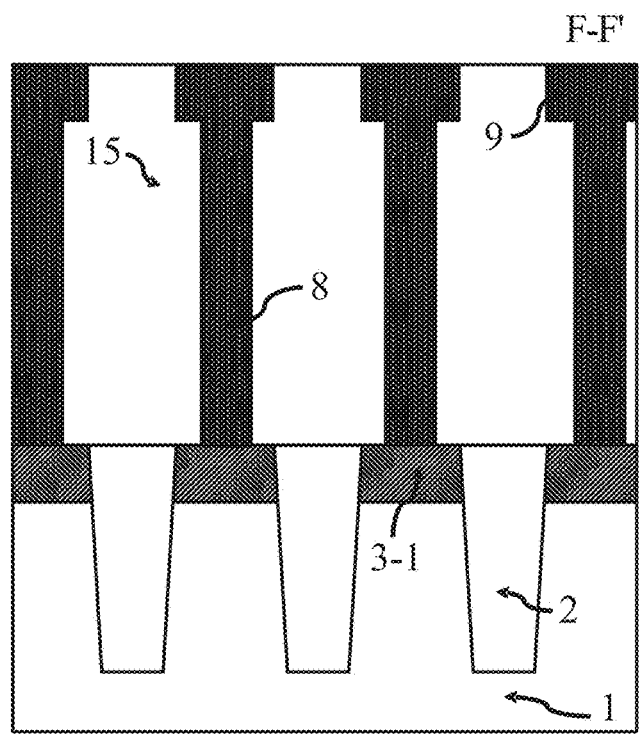
FIG. 14 is a cross-sectional view along F-F' line in FIG. 3.

FIG. 14 is the cross-section along F-F' line in FIG. 3, where the cross-section is cut out along the bit line contacts 8 which is adjoining to FIG. 10.

Figure 23:
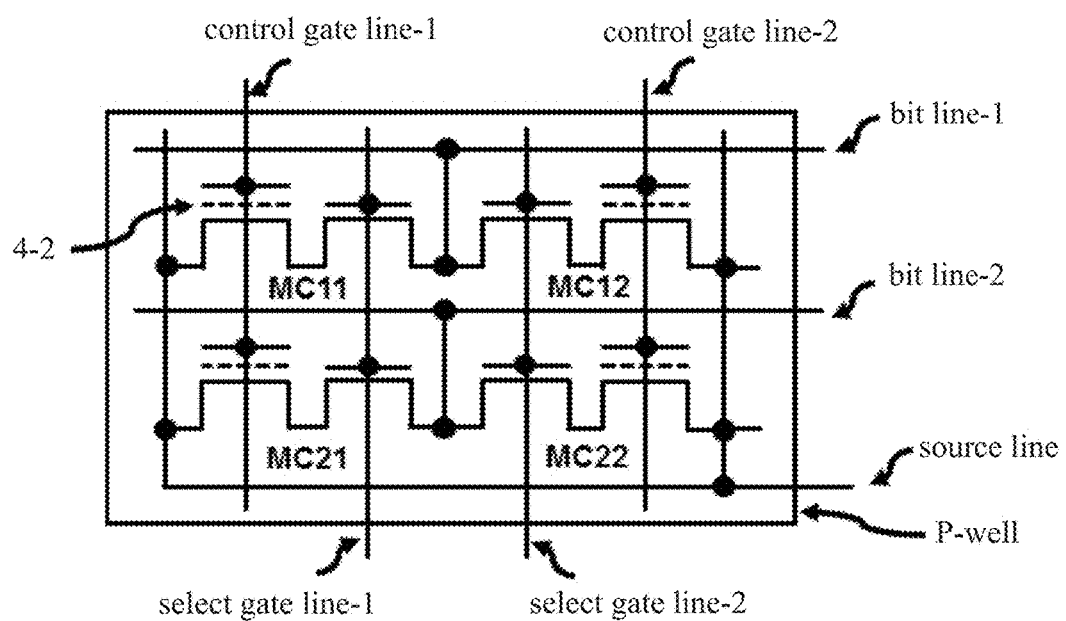
FIG. 23 is an equivalent circuit diagram corresponding to Tables 1 and 2.

Table 1 describes the first method of voltage application related to the present invention, where distributed potentials are shown in modes of write, erasure, and read. FIG. 23 is the equivalent circuit diagram corresponding to Table 1. If the control gate line-1 and the bit line-1 are selected, the memory cell MC11 is selected. In Table 1, the write is performed by SSI and the erasure is performed by BTBT. The circuit illustrated in FIG. 23 is called the common source line method.

TABLE 1 the first method of voltage application related to the present invention.

| | bit line-1 | bit line-2 | control gate line-1 | control gate line-2 | select gate line-1 | select gate line-2 | source line | P-well |
|---|---|---|---|---|---|---|---|---|
| Write | VBLP1 | VBLP2 | VCGP | | VSGP1 | VSGP2 | VSLP | VGNDP |
| Erasure | VBLE1 or floating potential | | VCGE1 | | VSGE1 or floating potential | | VSLE1 | VGNDE |
| Read | VBL | VBLU or floating potential | VCG | VCG or VCGU | VSG | VSGU | VSL | VGND |

To write the memory cell MC11, the control gate line-1 and the bit line-1 are selected in FIG. 23, where MC11 is located at a cross-point of those lines. Then, electrons are injected to a charge the storage layer 4-2 of MC11 by SSI. On the other hand, electrons are almost not injected to charge the storage layers of other memory cells, such as MC12, MC21, and MC22, not to be written. In FIG. 23, the bit line-1 is applied with VBLP1 to write MC11 while the bit line-2 is applied with VBLP2 to write neither MC21 nor MC22. The control gate line-1 and the control gate line-2 are applied with VCGP to write the selected cell. The select gate line-1 is applied with VSGP1 to write MC11 while the select gate line-2 is applied with VSGP2 to write neither MC12 nor MC22. The source line is applied with VSLP to write the selected cell, and the P-well in the memory cell region is applied with VGNDP. Here, VBLP1, VBLP2, VCGP, VSGP1, VSGP2 VSLP, and VGNDP are ranging from about 0V to 1V, about 1V to 2V, about 7V to 12V, about 1V to 2V, about −2V to 0V, about 4V to 7V, and about 0V, respectively. In the selected memory cell MC11, the transistors connecting to the control gate line-1 and the select gate line-1 are turned on, and, then, the electric current flows from the bit line-1 to the source line. In this event, electrons are accelerated on a channel surface between the control gate line-1 and the select gate line-1, since the potentials of the source line and the control gate line-1 (VSGP1 and VCGP1, respectively) are comparatively high while the potential of the select gate line-1 (VSGP1) is comparatively low. Those electrons may have high energies to be able to come over the band barrier of the gate insulating film. Then, they are injected into the charge storage layer 4-2 by the SSI. In this way, the threshold voltage of the transistor with the control gate of the memory cell MC11 is shifted positive, and, then, the write execution is completed. In the memory cell MC21, the select transistor is turned off since the potential of the bit line-2 (VBLP2) is in the same level or higher than that of the select gate line-1 (VSGP1). In the memory cells MC12 and MC22, the potential of the select gate line-2 (VSGP2) causes the select transistor to be turned off. In those unselected memory cells, MC21, MC12, and MC22, the select transistors are turned off, and, then, the electric current may not flow through channels. Thus, electrons are hardly almost not injected into the charge storage layers 4-2 of unselected memory cells. Thereby, the threshold voltages of the transistors with the control gates of the unselected memory cells, MC21, MC12, and MC22, are almost not changed while writing MC11.

The erasure of those four memory cells in FIG. 23 is performed simultaneously by the method described in Table 1, where the source line is common among those four cells. As illustrated in FIG. 6, the number of source lines to be actually combined to be a common may be flexibly selected from the minimum, two, to the maximum, i.e., the number of all source lines in the memory cell array. The memory cells to be simultaneously erased share a common source line. Therefore, the unit of memory cells to be simultaneously erased in the memory cell array may be determined by selecting the unit of the source lines to be combined to be a common.

In the erasure, the memory cells connecting to a common source line are selected. The holes are injected to the charge storage layers 4-2 of those selected memory cells in FIG. 23 by the BTBT. Then, the threshold voltages of the transistors with the control gates are shifted negative to complete the erasure execution. For the erasure in FIG. 23, the bit line-1 and the bit line-2 are given the potential VBLE1 or floating. The potential VCGE1 is applied to the control gate line-1 and control gate line-2. The select gate line-1 and select gate-2 are applied with the potential VSGE1 or floating. The source line is applied with the potential VSLE1. The P-well is applied with VGNDE. Here, VBLE1, VCGE1, VSGE1, VSLE1, and VGNDE are about 0V, about −3V to −6V, about 0V, about 4V to 7V, and about 0V, respectively. In the selected memory cells MC11, MC21, MC12, and MC22 in FIG. 23, the potentials of the control gate line-1 and the control gate line-2 are VCGE1. The potentials of the select gate line-1 and the select gate line-2 are VSGE1 or floating to turn off the channels. The potential of the source line VSLE1 is positive, which is high enough to cause BTBT. Thus, electrons and the holes having high energies are generated on the source line side of the control gates. Since the potentials of the control gate line-1 and the control gate line-2, VCGE1, is lower than that of the P-well, VGNDE, some of the holes are injected to the silicon nitride films 4-2 serving as the charge storage layers. Thereby, the threshold voltages of the transistors with the control gates are shifted negative to execute the erasure.

To read the selected memory cell MC11, i.e., the memory cell at the cross-point of the control gate line-1 and the bit line-1, the bit line-1 is applied with VBL to read MC11 while the bit line-2 is applied with VBLU or floating not to read the unselected cells MC21 and MC22. The control gate line-1 and the control gate line-2 are applied with VCG to read the selected memory cell. The select gate line-1 is applied with VSG to read the selected cell, while the select gate line-2 is applied with VSGU not to read the unselected memory cells. The source line is applied with VSL to read the selected cell. The P-well is then applied with VGND. In this event, it may be also able to apply different voltages to the control gate line-1 and the control gate line-2, where the unselected control gate line-2 may be applied with VCGU not to read. Here, VBL, VBLU, VCG, VCGU, VSG, VSGU, VSL, and VGND are about 0.5V to 2V, about 0V to 0.5V, about 0V to 3V, about −2V to 0V, about 1V to 2V, about −2V to 0V, about 0V to 0.5V, and 0V, respectively. It is noted that if the threshold voltage of the control gate transistor of the selected memory cell MC11 is lower than VCG, which is the potential applied to the control gate line-1, the electric current may flow from the bit line-1 to the source line. Otherwise, the electric current almost does not flow. As illustrated in FIGS. 5 and 6, the bit line current may be detected by the sense-amplifier connecting to the bit line, and, then, the result may be stored as data of "0" or "1" according to the existence of the current. The bit line-2 is unselected by the bit line decoder. Then, it is not connected to the sense-amplifier, and the data is not sensed.

Table 2 describes the second method of the voltage application related to the present invention, where distributed potentials are shown in modes of write, erasure, and read. FIG. 23 is the equivalent circuit diagram corresponding to Table 2.

TABLE 2 the second method of the voltage application related to the present invention.

| | bit line-1 | bit line-2 | control gate line-1 | control gate line-2 | select gate line-1 | select gate line-2 | source line | P-well |
|---|---|---|---|---|---|---|---|---|
| Write | VBLR1 | VBLR2 | VCGP | | VSGP1 | VSGP2 | VSLP | VGNDP |
| Erasure | VBLE2 or floating potential | | VCGE2 | | VSGE2 or floating potential | | VSLE2 or floating potential | VPWE |
| Read | VBL | VBLU or floating potential | VCG | VCG or VCGU | VSG | VSGU | VSL | VGND |

The methods of write and read in Table 2 is the same as in Table 1, so that the description of write and read in Table 2 may thus be omitted. In Table 2 and FIG. 23, the erasure of four memory cells is done simultaneously. The memory cells to be simultaneously erased by FN tunneling are distributed in a memory cell array block, where all memory cells are included in a common P-well. Thus, the number of memory cells to be simultaneously erased may be tuned by revising the memory cell array block on a common P-well.

In the mode of erasure, all memory cells included into a P-well are simultaneously selected. The electrons stored in the charge storage layers 4-2 of the selected memory cells MC11, MC21, MC12 and MC22 in FIG. 23 are removed therefrom by a tunneling effect. Then, the threshold voltages of the control gate transistors are shifted negative to complete the erasure execution. In FIG. 23, the bit line-1 and the bit line-2 are applied with VBLE2 or floating to execute the erasure. The control gate line-1 and the control gate line-2 are applied with VCGE2 to execute the erasure. The select gate line-1 and the select gate line-2 are applied with VSGE2 to execute the erasure. The source line is applied with VSLE2 or floating to execute the erasure. The P-well is applied with VPEW. Here, VBLE2, VSGE2, VSLE2, and VPWE are about 5V to 7V, while VCGE2 is about −5V to −8V. It may be also possible that VBLE2, VSGE2, VSLE2 and VPWE are about 0V while VCGE2 is about −10V to −15V. In the selected memory cells MC11, MC21, MC12, and MC22 of FIG. 23, electrons stored in the charge storage layers 4-2 are emitted to the P-well by the tunneling effect due to a large voltage difference between VCGE2 of the control gate line-1 and the control gate line-2 and VPWE of the P-well. Thus, the threshold voltage of the control gate transistor is shifted negative to execute the erasure.

FIGS. 19-22 are the drawings to briefly illustrate an example of fabrication methods of memory cells related to the present invention.

Figure 19:
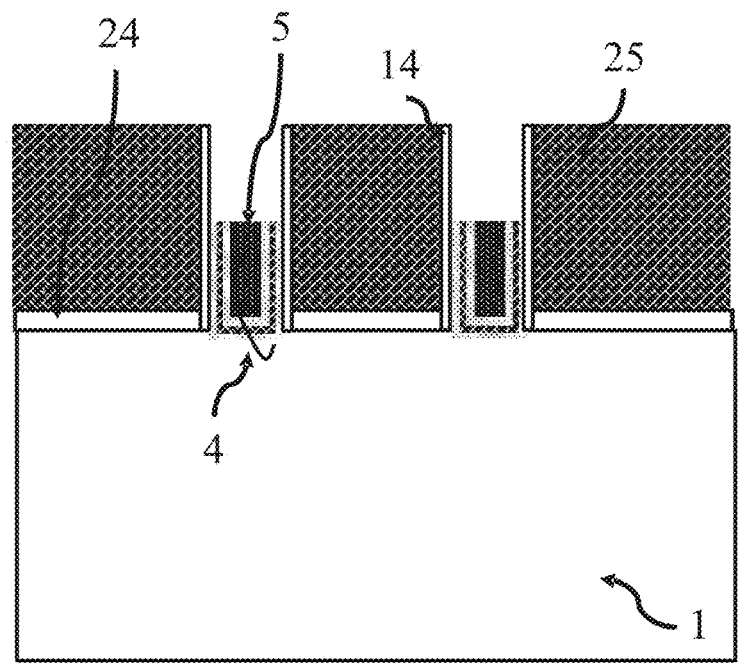
FIG. 19 shows the first outline of the fabrication method of the flash memory related to the present invention.

As illustrated in FIG. 19, the sacrifice film 24, such as Silicon oxide, and the sacrifice film 25, such as Silicon Nitride, which serve as sacrifice films, are formed on the P-well 1. The U-shaped groove is formed on a portion of those films, whose bottom of the groove reaches the top of the P-well or is lower than the top of the P-well, and an insulating film 14 and multiple insulating films 4 are formed therein. The center insulating film has many trap states, can store many charges in these trap states, and can serve as a charge storage layer. The control gate 5 is embedded in the U-shape groove on the multiple laminated insulators 4.

Figure 20:
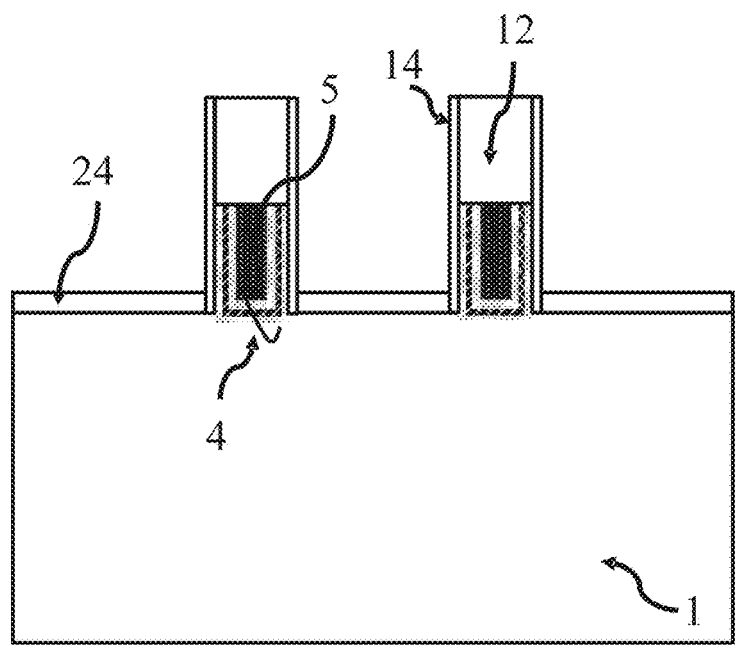
FIG. 20 shows the second outline of the fabrication method of the flash memory related to the present invention.

As illustrated in FIG. 20 next to FIG. 19, the insulating film 12 is formed on the control gate 5 in a self-aligned manner. Then, the sacrifice 25 serving as the sacrifice film is removed.

Figure 21:
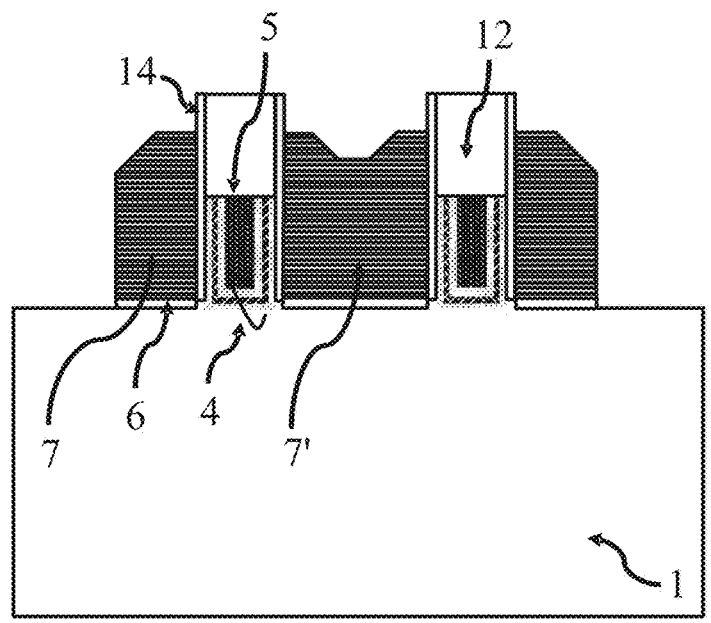
FIG. 21 shows the third outline of the fabrication method of the flash memory related to the present invention.

As illustrated in FIG. 21 next to FIG. 20, a gate insulating film 6 and an insulating film 14 are formed after removing the sacrifice film 24. A select gate 7 and a pseudo-gate 7' are formed on the side walls of the control gate 5 and the insulating film 12 thereon and on the gate insulating film 6 by a self-alignment method.

Figure 22:
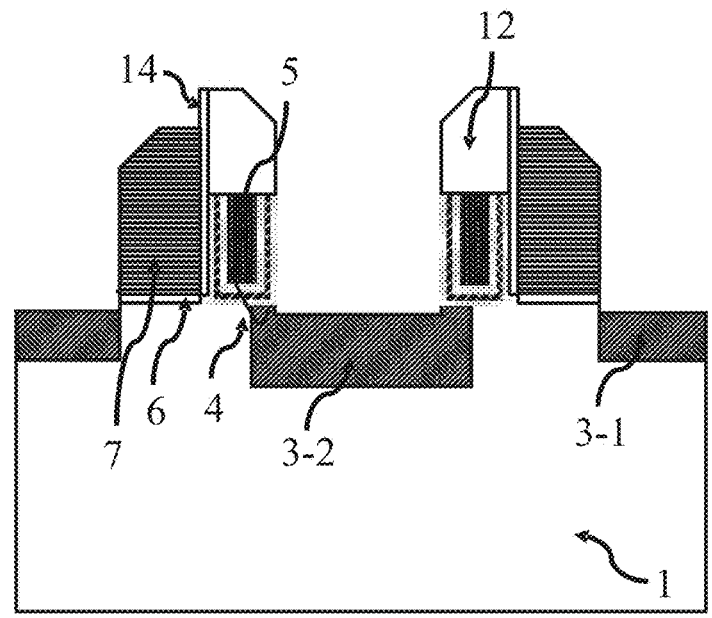
FIG. 22 shows the fourth outline of the fabrication method of the flash memory related to the present invention.

As illustrated in FIG. 22 next to FIG. 21, the select gate 7 is left after removing the pseudo-gate 7'. There are diffusion layers having the opposite conductivity type to the P-well 1 at both ends of the adjoining control gate 5 and the select gate 7. Those diffusion layers may be the source (3-2) and the drain (3-1). In this event, the diffusion layer in the source, the select gate 7 and the gate insulating film 6 thereunder may be identical to those of the periphery memory cell control circuit transistors or other logic circuit transistors.

In the above description of embodiments, values, materials, operations, and circuits are just general and do not limit structures and operation methods related to the essence of the present invention.

In the above-mentioned embodiments, the multiple insulating films 4 has been assumed to be a 3-layer insulating film. However, this is not limiting. For example, the first insulating film may be a lamination of thin films of silicon oxide, silicon nitride or alumina. The second insulating film serving as the charge storage layer may be hafnium oxide film, alumina film or a lamination of them as well as silicon nitride. The third insulating film may be alumina film, silicon nitride film or a lamination of them as well as silicon oxide film. In addition, a portion of those layers may be insulating films with high or low permittivity. Moreover, the charge storage layer may be a film including nano-crystals of silicon, aurum, or platinum, which may be distributed therein.

The present disclosure provides a cheap and high performance 1.5 transistor type flash memory which is compatible to periphery memory cell control circuit transistors or other logic circuit transistors.

What is claimed is:

1. A flash memory comprising:
a silicon substrate;
a periphery memory cell control circuit disposed on the silicon substrate; and
a memory cell unit connecting to the periphery memory cell control circuit and including laminated insulating films with a U-shaped groove, wherein the laminated insulating films have three or more layers formed on the silicon substrate, wherein a middle layer of the laminated insulating films is a charge storage layer, wherein a control gate is embedded in the U-shaped groove of the laminated insulating films, wherein the memory cell unit includes a select gate insulating film and a select gate formed on the silicon substrate, wherein the select gate insulating film and the select gate are adjacent to a first side of the laminated insulating films, wherein an end of the select gate has a drain region and an end of the control gate has a source region, wherein the charge storage layer stores negative or positive charge,
wherein each of the laminated insulating films is in an inseparable form.

2. The flash memory as claimed in claim 1, wherein the periphery memory cell control circuit comprises a logic circuit.

3. The flash memory as claimed in claim 1, further comprising a well sandwiched between the memory cell unit and the silicon substrate.

4. The flash memory as claimed in claim 1, wherein an interlayer insulating film is sandwiched between the first side of the laminated insulating film and the select gate.

5. The flash memory as claimed in claim 1, wherein the control gate comprises polycrystalline silicon or a low resistive metal material selected from titanium, titan nitride, tungsten, aluminum, copper, composite materials thereof, and films thereof.

6. The flash memory as claimed in claim 1, wherein the periphery memory cell control circuit includes a plurality of transistors, wherein each of the plurality of transistors includes a gate insulating film, wherein the select gate insulating film in the memory cell unit and at least one of gate insulating films in the plurality of transistors of the periphery memory cell control circuit are formed simultaneously, the select gate in the memory cell unit and at least one of gate electrodes in the periphery memory cell control circuit are formed simultaneously, and the source region in the memory cell unit and at least one of source or drain regions in the periphery memory cell control circuit are formed simultaneously.

7. The flash memory as claimed in claim 1, wherein an injection of the negative charge to the charge storage layer is performed at the memory cell unit to program during a programming operation, and current does not flow from the source region to the drain region for a reading operation, wherein an injection of the positive charge to the charge storage layer is performed at the memory cell unit to erase during an erase operation, wherein the current flows from the source region to the drain region for the reading operation, wherein the programming operation is done by applying 0~1V to the drain region, 7~12V to the control gate, 1~2V to the select gate, 4~7V to the source region, and 0.5~0.5V to the silicon substrate, respectively, and wherein the erase operation is done by applying 0~1V to the drain region, −3~−6V to the control gate, −1~1V to the select gate, 4~7V to the source region, and −0.5~0.5V to the silicon substrate, respectively, wherein the read operation is done by applying 0.5~2V to the drain region, 0~3V to the control gate, 1~2V to the select gate, 0~0.5V to the source region, and −0.5~0.5V to the silicon substrate, respectively.

8. The flash memory as claimed in claim 3, wherein an injection of the positive charge to the charge storage layer is performed at the memory cell unit to erase during an erase operation, and current flows from the source region to the drain region for a reading operation, and wherein the erase operation is done by applying 5~7V to the well and −5~−8V to the control gate, respectively, or by applying 0V to the well and −10~−15V to the control gate, respectively.

9. The flash memory as claimed in claim 1, further comprising one or more of additional memory cell units, wherein the memory cell unit and the one or more of additional memory cell units form a memory cell array which has a plurality of control gate lines, and wherein the plurality of control gate lines is connected with each other and commonly used.

10. The flash memory as claimed in claim 1, further comprising one or more of additional memory cell units, wherein the memory cell unit and the one or more of additional memory cell units form a memory cell array which has a plurality of source lines, and wherein the plurality of source lines is connected with each other and commonly used.

11. The flash memory as claimed in claim 1, wherein the charge storage layer is a film comprising a material selected from silicon nitride, silicon, metal oxide, nanocrystals of silicon, and nanocrystals of metal.

12. A flash memory comprising:
a silicon substrate;
a periphery memory cell control circuit disposed on the silicon substrate; and
a memory cell unit connecting to the periphery memory cell control circuit, including laminated insulating films with a U-shaped groove, wherein the laminated insulating films have three or more layers formed on the silicon substrate, wherein a middle layer of the laminated insulating films is a charge storage layer, wherein a control gate is embedded in the U-shaped groove on the laminated insulating films, wherein the memory cell unit includes a select gate insulating film and a select gate formed on the silicon substrate, wherein the select gate insulating film and the select gate are adjacent to a first side of the laminated insulating films, wherein an end of the select gate has a drain region and an end of the control gate has a source region, wherein the charge storage layer stores negative or positive charge,
wherein a bottom of the laminated insulating films below the control gate has a height lower than a height of a bottom of the select gate insulating film.

13. The flash memory as claimed in claim 1, wherein the memory cell unit comprises a cell isolation region formed on the silicon substrate, wherein a bottom of the control gate is lower than the cell isolation region and extended thereinto, and wherein the memory cell unit comprises a channel extending from an upper surface of the silicon substrate to an upper boundary of the cell isolation region.

14. A flash memory comprising:
a silicon substrate;
multiple insulating films laminated in a form of an inseparable U-shaped groove on the silicon substrate;
a control gate embedded in the U-shaped groove of the multiple insulating films; and
a select gate located adjacent to a first side of the control gate, wherein the multiple insulating films includes a charge storage layer.

15. The flash memory as claimed in claim 14, further comprising a P-well and a N-well sandwiched between the laminated insulating films and the silicon substrate.

16. The flash memory as claimed in claim 14, wherein the select gate is formed on an insulating film on the first side of the control gate in a self-aligned manner after forming the control gate and the multiple insulating films.

* * * * *